(12) United States Patent
Kaneko

(10) Patent No.: US 6,184,754 B1
(45) Date of Patent: Feb. 6, 2001

(54) VOLTAGE-CONTROLLED OSCILLATOR CIRCUIT AND VOLTAGE-CONTROLLED OSCILLATING METHOD

(75) Inventor: Makoto Kaneko, Tokyo (JP)

(73) Assignee: NEC Corporation, Tokyo (JP)

(*) Notice: Under 35 U.S.C. 154(b), the term of this patent shall be extended for 0 days.

(21) Appl. No.: 09/258,394

(22) Filed: Feb. 26, 1999

(30) Foreign Application Priority Data

Mar. 3, 1998 (JP) .................................................. 10-050801

(51) Int. Cl.$^7$ ...................................................... H03B 5/24
(52) U.S. Cl. .............................. 331/57; 331/1 A; 331/45; 331/49; 331/74; 327/159
(58) Field of Search ............................... 331/57, 1 A, 45, 331/49, 74, 177 R; 327/159, 156

(56) References Cited

U.S. PATENT DOCUMENTS 5,446,417 * 8/1995 Korhonen ................................ 331/57

FOREIGN PATENT DOCUMENTS

| 60-62147 | 4/1985 | (JP) . |
| 61-65620 | 4/1986 | (JP) . |
| 5-136657 | 6/1993 | (JP) . |
| 6-334515 | 12/1994 | (JP) . |
| 7-254847 | 10/1995 | (JP) . |

OTHER PUBLICATIONS

Toshiyuki Okuyama et al., "Design of a 3GHz GaAs PLL–Based Clock Pulse Generator", Shingaku–Giho No. ED93–152, Jan. 1994, pp. 31–38. *Institute of Electronics, Information and Communication Engineers in Japan.*

* cited by examiner

*Primary Examiner*—Arnold Kinkead
(74) *Attorney, Agent, or Firm*—Young & Thompson

(57) ABSTRACT

A VCO has n inverters connected to each other in a ring, wherein the inverters have a depletion-mode FET. A selector control circuit produces a select signal based upon a threshold voltage of a selector depletion-mode FET to select one of an output derived from a (n–i)-th inverter, or another output signal derived from the n-th inverter. Because the selector FET and the inverter FETs are made using the same process steps and thus have the same device parameters, the selector FET has the same threshold voltage variation as the inverter FETs. Based upon the variation in the FET threshold voltage, the selected output is provided to an input of a first inverter. The VCO operates at a constant frequency by changing the total number of inverters in the ring to compensate for the variation in the threshold voltage of the depletion-mode FETs in the inverters, as determined by the depletion-mode FET in the selector circuit.

18 Claims, 6 Drawing Sheets

VOLTAGE-CONTROLLED OSCILLATOR CIRCUIT AND VOLTAGE-CONTROLLED OSCILLATING METHOD

BACKGROUND OF THE INVENTION

1. Field of the Invention

The present invention generally relates to a voltage-controlled oscillator circuit and a voltage-controlled oscillating method, capable of changing an oscillating frequency in response to an externally supplied control voltage. More specifically, the present invention is directed to a technique suitable for realizing a voltage-controlled oscillator circuit by employing a phase-locked loop (PLL) circuit.

2. Description of the Related Art

Conventionally, this sort of voltage-controlled oscillator circuit is known as, for instance, a circuit shown in FIG. 1. This conventional voltage-controlled oscillator circuit is described more in detailed, for example, in "3 GHz GaAs PLL clock pulse generator" written by T. OKUYAMA and T. ENOMOTO, Shingaku-Giho No. ED93-152 published by the institute of Electronics, Information and Communication Engineers in JAPAN.

As indicated in FIG. 1, the conventional voltage-controlled oscillator circuit has inverters $101_1$ to $101_3$. These inverters $101_1$ to $101_3$ invert a polarity of a signal entered from an input terminal $T_I$, and output the polarity-inverted signal from an output terminal $T_O$. In general, such a circuit is referred to as a "ring oscillator". This ring oscillator is constituted by connecting the odd number (three inverters in FIG. 1) of inverters in a ring shape.

That is, the first inverter $101_1$ is constituted by an enhancement-mode field-effect transistor (E-FET) QE1, a first depletion-mode field-effect transistor (D-FET) QD1, and a second depletion-mode field-effect transistor QD2. A source electrode S of the E-FET QE1 is connected to the ground potential, and a gate electrode G thereof is connected to the input terminal $T_I$. A gate electrode G of the first D-FET QD1 is connected to a drain electrode of the E-FET QE1, and a source electrode S of this first D-FET QD1 is connected to this drain electrode of the E-FET QE1, and also a drain electrode D thereof is connected to a power supply Vd. A source electrode S of the second D-FET QD2 is connected to the drain electrode D of the E-FET QE1, and a drain electrode D of this second D-FET QD2 is connected to the power supply Vd. Both a drain electrode D of the E-FET QE1 and a source electrode S of the first D-FET QD1 are connected to the output terminal $T_O$, and a gate electrode G of the second D-FET QD2 is connected to a voltage control terminal Tc. A control voltage Vc used to vary an oscillating frequency is applied to this voltage control terminal Tc. It should be noted that the structures of the inverters $101_2$ and $101_3$ are identical to the structure of the above-explained inverter $101_1$.

In this ring oscillator circuit arrangement, the E-FET QE1 among the respective structural elements of the inverter $101_1$ is operable as a driver circuit for driving the next-staged inverter $101_2$, and the first D-FET QD1 constitutes a load of this E-FET QE1. The load current flowing through the inverter $101_1$ may be controlled by connecting the second D-FET QD2 in parallel to this load transistor, namely the first D-FET QD1. In this inverter $101_1$, a current established by summing a constant current flowing through QD1 with a variable current (variable by control voltage $V_c$) flowing through QD2 will flow. This summed current may determine the propagation delay time "tpd" of the inverter 101. Both the inverter 1012 and the inverter $101_3$ are operable in a similar manner to that of the above-explained inverter $101_1$.

Since the oscillating frequency of the voltage-controlled oscillator circuit is varied in response to the propagation delay time of the overall circuit arrangement, this oscillating frequency can be controlled based upon the control voltage $V_c$. For instance, when the current flowing through the second D-FET QD2 is decreased by lowering this control voltage $V_c$, the pull-up ability of QD2 with respect to the power supply Vd is weakened. As a result, the propagation delay time tpd of each of the inverters is increased, so that the oscillating frequency of the voltage-controlled oscillator circuit is lowered. Conversely, when the current flowing through the second D-FET QD2 is increased by increasing the control voltage $V_c$, the pull-up ability thereof with respect to the power supply Vd is strengthened. As a result, the propagation delay time tpd of each of the inverters is decreased, so that the oscillating frequency of the voltage-controlled oscillator circuit is increased.

FIG. 2 is a diagram for showing a relationship of the oscillating frequency with respect to the threshold voltage Vt of the D-FET used in a voltage-controlled oscillator circuit similar to the voltage controlled oscillator circuit indicated in FIG. 1, namely a graphic representation for indicating a permitted variation range of the threshold voltage Vt by which the conventional oscillator circuit can be oscillated at various frequencies. An abscissa of the graphic representation shown in FIG. 2 indicates a threshold voltage [V] of the D-FET, whereas an ordinate thereof represents an oscillating frequency [GHz] (VCO oscillating frequency) of this voltage-controlled oscillator circuit. In other words, FIG. 2 represents a simulation result of a permitted variation range for various threshold voltages at which the conventional voltage-controlled oscillator can be oscillated in various frequencies, while varying the control voltage from 0.1V to 0.8V. In this simulation, as with this conventional voltage-controlled oscillator circuit, a ring oscillator arranged by 9 sets of inverters with employment of GaAs D-FETs and GaAs E-FETs is employed. Also, the power supply voltage is selected to be 2[V].

As indicated in FIG. 2, in the case that the conventional voltage-controlled oscillator circuit is oscillated at the frequency of 1[GHz], the permitted variable range of the threshold voltage Vt of the D-FET is defined from −0.70[V] to −0.30[V], namely 0.40[V].

There are some possibilities that the threshold voltage Vt of the D-FET is shifted, or deviated from the designed value, because of fluctuations occuring when this D-FET is manufactured. In this case, while the gate-to-source voltage $V_{gs}$ of the first D-FET QD1 which constitutes the inverter is a constant voltage (=0[V]), since the value of the current flowing through the first D-FET QD1 is varied, the oscillating frequency is shifted from a desirable frequency.

A voltage-controlled oscillator circuit is mainly employed in a loop of a PLL circuit, and is required to be oscillated at a preselected frequency (for example, 1[GHz]) in response to an input voltage. However, there is a certain possibility that when the above-explained voltage-controlled oscillator circuit is employed in a PLL circuit, since the permitted variation range of the threshold voltage Vt of the D-FET is narrow, this voltage-controlled oscillator cannot be oscillated under stable condition.

As the related art, for instance, Japanese Laid-open Patent Disclosure (JP-A-Heisei 6-334515) discloses "PHASE-SYNCHRONIZED OSCILLATOR CIRCUIT". In this phase-synchronized oscillator circuit, a ring oscillator is arranged by the first to fifth inverter chains, the basic inverter chain, and the first to fifth selectors. In the first to fifth inverter chains, 2 sets of inverters; 4 sets of inverters; 8 sets of inverters; 16 sets of inverters; and 32 sets of inverters are series-connected to each other respectively. In the basic inverter chain, the even numbers of inverters are series-connected to each other. The first to fifth selectors control whether or not each of these first to fifth inverter chains is engaged into the loop. Also, this phase-synchronized oscillator circuit is arranged by the phase comparing circuit, and the up/down counter. The phase comparing circuit compares the phase of the input clock signal with the phase of the oscillator clock signal produced from the ring oscillator. The up/down counter counts up/down the oscillator clock signal in response to the output signal derived from this phase comparing circuit. In response to the signal supplied from this up/down counter, the first to fifth selectors are controlled so as to synchronize the phase of the oscillator clock signal with the phase of the input clock signal.

Also, Japanese Laid-open Patent Disclosure (JP-A-Heisei 5-136657) discloses "RING OSCILLATOR CIRCUIT". In this ring oscillator circuit, the first ring oscillator is constituted in such a manner that the first to fifth inverters are series-connected to each other and connected in a ring shape while these inverters sandwich the N-channel transistor. Also, as the path for shortcutting the series connection of these first to fifth inverters, the P-channel transistor is provided between the cathode of the first inverter and the anode of the third inverter. The respective N-channel and P-channel transistors are ON/OFF-controlled in order to switch the stage number of the inverters.

Also, Japanese Laid-open Patent Disclosure (JP-A-Heisei 7-254847) discloses "OSCILLATOR CIRCUIT AND PLL CIRCUIT". In this oscillator circuit/PLL circuit, the ring oscillator is constituted as follows. That is, a plurality of inverters are connected in the multiple stages, the signals are derived from the odd-numbered inverters including the final-staged inverter, and these derived signals are fed back via the selector to the input terminal of the first-staged inverter. Also, current may be supplied via the current-controlling MOSFETs to the respective inverters. In this oscillator circuit/PLL circuit, the signals which should be fed back to the input terminal of the first-staged inverter are switched by the selector so as to largely vary the oscillating frequency. Also, the oscillating frequency is fine adjusted by changing the gate voltage of the current-controlling MOSFET.

Furthermore, Japanese Laid-open Patent Disclosure (JP-A-Showa 61-65620) discloses "OSCILLATOR CIRCUIT". This oscillator circuit is equipped with the first inverter series, the second inverter series, and also the inverter series switching means. In the first inverter series, the even-numbered inverters are series-connected to each other in a ring shape. In the second inverter series, a predetermined number of inverters are series-connected to each other. In response to the externally-supplied signal, the inverter series switching means may switch a portion of the first inverter series and the second inverter series.

Moreover, Japanese Laid-open Patent Disclosure (JP-A-Showa 60-62147) discloses "BIAS VOLTAGE GENERATING CIRCUIT". In response to the condition of the memory, such as the standby condition, this bias voltage generating circuit switches the stage number of the inverters for constituting the ring oscillator. Since the stage number of these inverters is varied, the unnecessary power consumption of the memory during the standing condition can be suppressed.

However, none of the above-described conventional techniques considers the permitted variable range of the threshold voltage for the depletion-mode field-effect transistor used in the inverter. Therefore, these conventional techniques could not solve the above-explained problem. That is, when this threshold voltage is largely shifted from the designed value, stable oscillation cannot be realized.

SUMMARY OF THE INVENTION

The present invention has been made to solve the above-described problem of the conventional techniques, and therefore, has an object to provide a voltage-controlled oscillator circuit and a voltage-controlled oscillating method, capable of extending a permitted variable range of a threshold voltage of a depletion-mode field-effect transistor, in which the voltage-controlled oscillator can be oscillated at a desirable frequency.

To achieve the above-described object, a voltage-controlled oscillator circuit, according to a first aspect of the present invention, is featured by comprising:

n (n is an odd positive integer) inverters connected to each other in a serial connection;

a selector control circuit containing a field-effect transistor as a selector field-effect transistor, for producing a select signal based on a threshold voltage of the selector field-effect transistor; and a selector for selecting one of an output signal from an (n−i)-th one (i is an positive integer and smaller than n) of the n inverters and another output signal from an n-th one of the n inverters in response to the select signal produced from the selector control circuit, to supply the selected signal to a first one of the n inverters.

In the voltage-controlled oscillator circuit according to the first aspect, the selector control circuit produces the select signal in such a manner that the threshold voltage of the selector field-effect transistor is smaller than or equal to a preselected value, the selector selects the output signal from the (n−i)-th one of n inverters, and such that when the threshold voltage of the selector field-effect transistor is larger than the preselected value, the selector selects the output signal from the n-th one of n inverter. Also, the selector field-effect transistor contained in the selector control circuit is preferably manufactured by a process which is the same as a process of manufacturing field-effect transistors contained in the n inverters.

Concretely speaking, the selector control circuit includes:
the selector field-effect transistor, a drain electrode of which is connected to a power supply;

a resistor having two ends, one end of which is connected to a gate electrode of the selector field-effect transistor and a source electrode thereof, and the other end of which is grounded; and a flip-flop to which a voltage signal applied from the one end of the resistor is set in synchronism with an externally supplied reset signal, and which supplies the set voltage signal as the select signal to the selector.

Otherwise, the selector control circuit includes:
the selector field-effect transistor, a drain electrode of which is connected to a power supply;

another field-effect transistor, a source electrode of which is connected to a ground potential, and a gate electrode and a drain electrode of which are connected to the gate electrode and the source electrode of the field-effect transistor; and a flip-flop for setting a voltage signal from the drain electrode of the other field-effect transistor in synchronism with an externally-supplied reset signal, and for supplying the set voltage signal as the select signal to the selector.

The voltage-controlled oscillator circuit, according to the present invention, is featured as follows. The selector is provided within the ring counter formed by n inverters. The selector control circuit is operated as follows in such a case that the threshold voltage of the depletion-mode field-effect transistor which constitutes the load for the output side of each of the inverters is decreased from the designed value. That is, this selector control circuit causes the selector to select the signal entered into one input terminal. Conversely, when the above-described threshold voltage is increased from the designed value, this selector control circuit causes the selector to select the signal entered into the other input terminal.

Now, in such a case that the threshold voltage of the selector depletion-mode field-effect transistor is shifted such that this threshold voltage becomes smaller than or equal to a preselected value (designed value), thus propagation delay time of each of the n inverters is thus prolonged to lower the oscillating frequency, and since the output signal from the (n−i)-th one of n inverters is selected by the selector, a total number of inverters for constituting the ring oscillator is thereby decreased, and this ring oscillator is operated to increase the oscillating frequency.

On the other hand, in such a case that the threshold voltage of the selector depletion-mode field-effect transistor is shifted such that this threshold voltage becomes larger than a preselected value (designed value), the propagation delay time of each of the n inverters is thus shortened to increase the oscillating frequency, and since the output signal from the nth one of the n inverter is selected by the selector, a total number of inverters for constituting the ring oscillator is thereby increased, and this ring oscillator is operated to decrease the oscillating frequency.

As a consequence, variation in the oscillating frequency caused by changing the threshold voltage of the selector depletion-mode field-effect transistor can by mitigated.

Similarly, to achieve the above-described object, a voltage-controlled oscillating method, according to a second aspect of the present invention, is featured by comprising:

(a) providing n (n is an odd positive integer) inverters connected to each other in a serial connection;

(b) producing a select signal based on a threshold voltage of a field-effect transistor as a selector field-effect transistor; and (c) selecting one of an output signal from an (n−i)-th one (i is an positive integer and smaller than n) of n inverters and another output signal from an n-th one of n inverters in response to the select signal produced in the (b) step, to supply the selected signal to a first one of the n inverters.

In this voltage-controlled oscillating method according to the second aspect, the (b) step includes:

(d) judging whether or not the threshold voltage of the selector field-effect transistor is smaller than or equal to a preselected value;

(e) producing the select signal such that the output signal from the (n−i)-th one of n inverters is selected when a judgement result of the (d) step is made that the threshold voltage of the selector field-effect transistor is smaller than or equal to the preselected value; and (f) producing the select signal such that the output signal from the n-th one of n inverters is selected when a judgment result of the (d) step is made that the threshold voltage of the selector field-effect transistor is larger than the preselected value.

In this case, the above-described (d) step includes:

(g) producing a voltage corresponding to the threshold voltages of each of the n inverters; and (h) judging whether or not the threshold voltage of the selector field-effect transistor is smaller than or equal to the preselected value, based on the voltage produced in the (g) step.

Similarly, to achieve the above-described object, a voltage-controlled oscillator circuit, according to a third aspect of the present invention, is featured by comprising:

n (n is an odd positive integer) inverters connected to each other in a serial connection;

select signal producing means containing a field-effect transistor as a selector field-effect transistor, for producing a select signal based on a threshold voltage of the selector field-effect transistor; and selecting means for selecting one of an output signal from an (n−i)-th one (i is an positive integer and smaller than the n) of the n inverters and another output signal from an n-th one of n inverters in response to the select signal produced in the select signal producing means, to supply the selected signal to a first one of the n inverters.

In this voltage-controlled oscillator circuit according to the third aspect, the select signal producing means includes:

judging means for judging whether or not the threshold voltage of the selector field-effect transistor is smaller than or equal to a preselected value;

first means for producing the select signal such that the output signal from the (n−i)-th one of n inverters is selected when a judgement result of the judging means is made that the threshold voltage of the selector field-effect transistor is smaller than or equal to the preselected value; and second means for producing the select signal such that the output signal from the n-th one of n inverters is selected when a judgment result of the judging means is made that the threshold voltage of the selector field-effect transistor is larger than the preselected value.

In this case, the above-described judging means includes:

third means for producing a voltage corresponding to the threshold voltages of each of the n inverters; and fourth means for judging whether or not the threshold voltage of the selector field-effect transistor is smaller than or equal to the preselected value, based on the voltage produced in the third means.

BRIEF DESCRIPTION OF THE DRAWINGS

A better understanding of the present invention may be obtain by reading the detailed description in conjunction with the accompanying drawings, in which.

DESCRIPTION OF THE PREFERRED EMBODIMENTS

Figure 1:
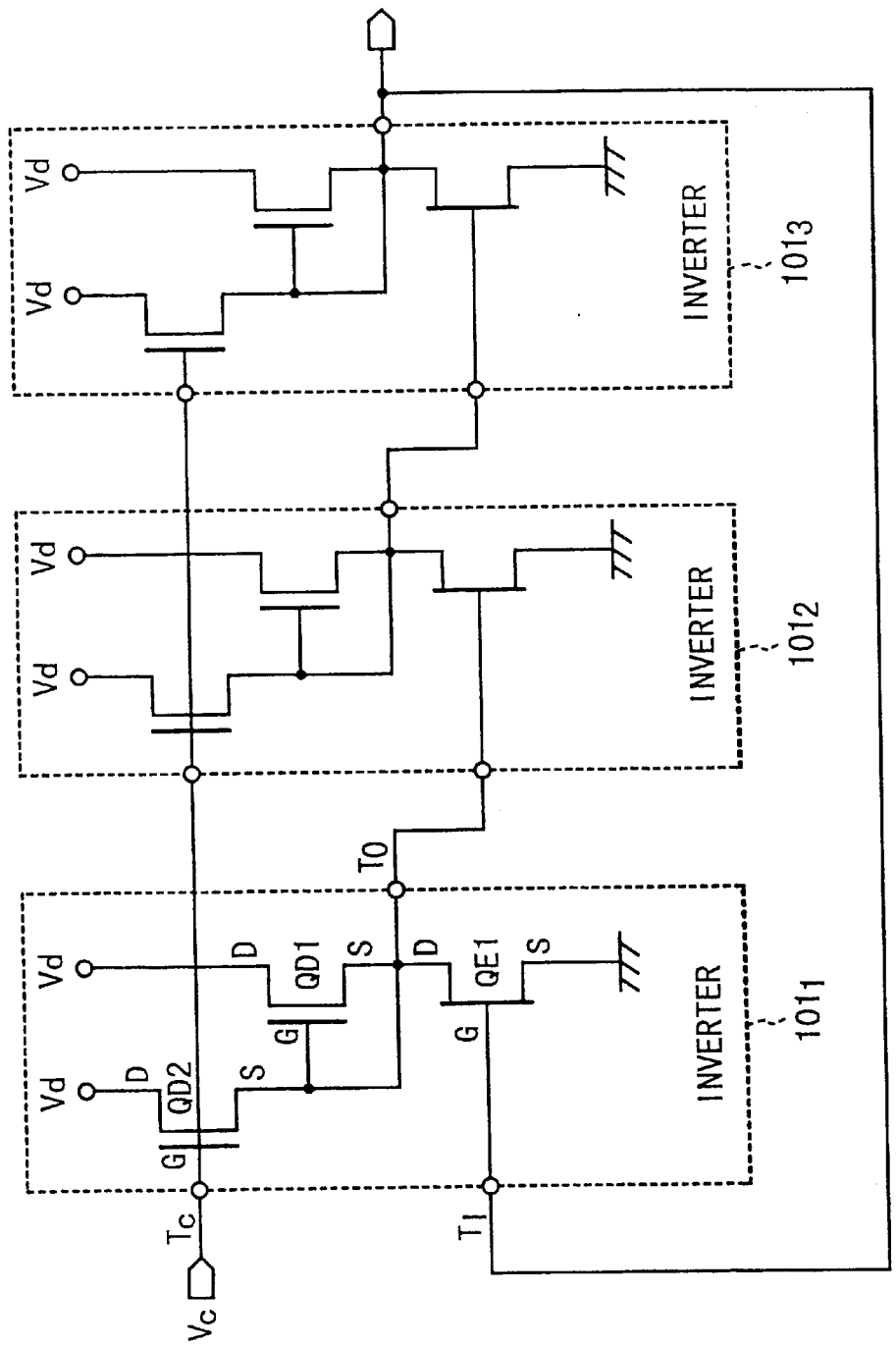
FIG. 1 is a circuit arrangement for showing the structure of the conventional voltage-controlled oscillator circuit.
Figure 2:
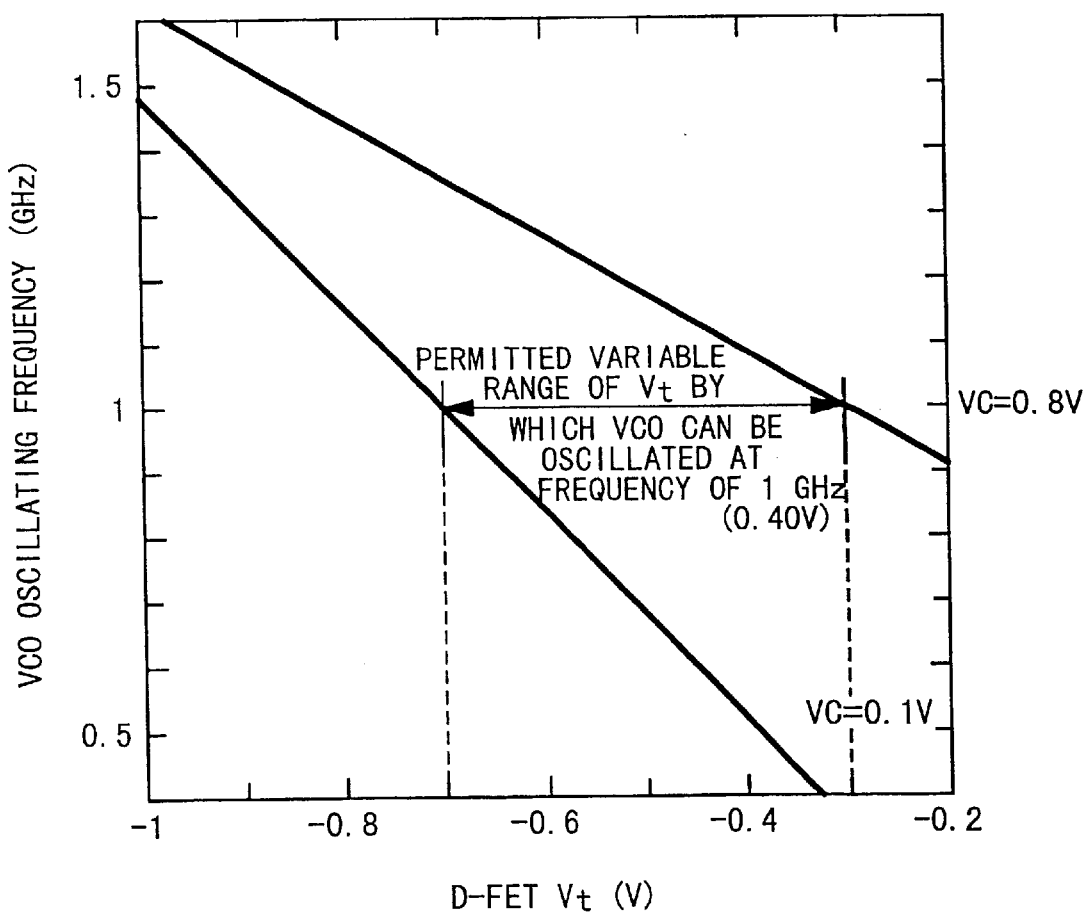
FIG. 2 is a diagram for showing a relationship of the oscillating frequency with respect to the threshold voltage Vt of the D-FET in the conventional voltage-controlled oscillator circuit indicated in FIG. 1, namely a graphic representation for indicating the permitted variation range of the threshold voltage Vt by which the oscillator circuit can be oscillated at various frequencies.

Referring now to the drawings, a voltage-controlled oscillator according to an embodiment of the present invention will be described. It should be understood that in the below-mentioned example, "i" according to the present invention is selected as "2".

Arrangement of First VCO

Figure 3:
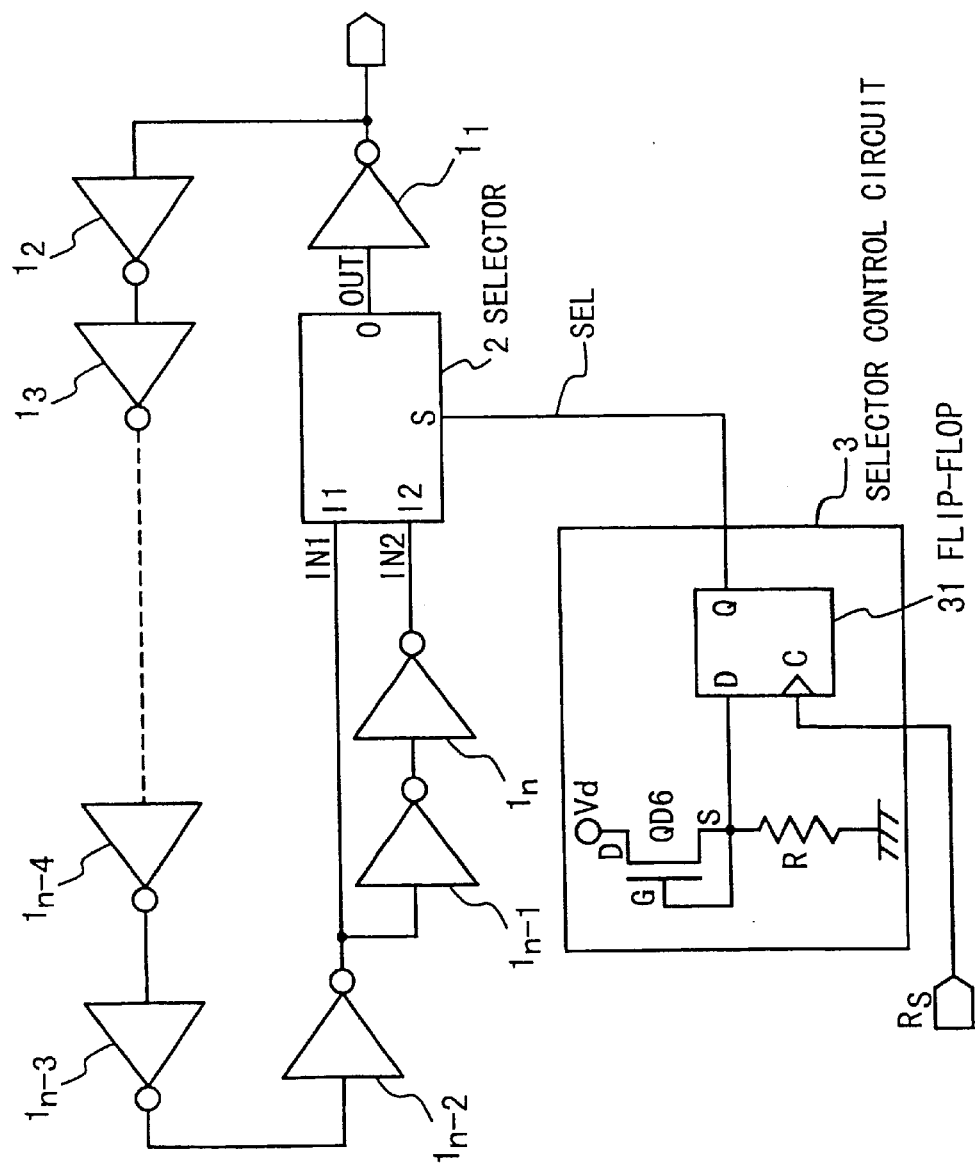
FIG. 3 is a circuit diagram for representing an arrangement of a voltage-controlled oscillator circuit according to a first embodiment of the present invention.

FIG. 3 is a circuit diagram for indicating an arrangement of a voltage-controlled oscillator circuit according to a first embodiment of the present invention. This first voltage-controlled oscillator (VCO) is constituted by "n" inverters $1_1$ to $1_n$; a selector 2; and also a selector control circuit 3. Symbol "n" implies a positive integer and is selected to be an odd number. The respective inverters $1_1$ to $1_n$ invert a polarity of an input signal, and then output the polarity-inverted signal. The selector 2 selects any one of a first input signal IN1 supplied to a first input terminal I1 and a second input signal IN2 supplied to a second input terminal I2 in response to a select signal SEL supplied to a select terminal S. Then, this selector 2 outputs the selected input signal as a selected signal OUT from an output terminal "O". The selector control circuit 3 produces the select signal SEL to be supplied to the select terminal S of the selector 2.

An input terminal of the inverter $1_1$ provided at a first stage is connected to the output terminal O of the selector 2, and an output terminal of this first-staged inverter $1_1$ is connected to an input terminal of the second-staged inverter $1_2$. An output terminal of the second-staged inverter $1_2$ is connected to an input terminal of the third-staged inverter $1_3$. The remaining inverters are similarly connected to the subsequent inverters in a serial manner. An output terminal of a final-staged (namely at an n-th stage) inverter $1_n$ is connected to the second terminal I2 of the selector 2. Also, an output terminal of the (n–2)th-staged inverter $1_{n-2}$ is connected to the first input terminal I1 of the selector 2.

With employment of the above-described circuit arrangement, such a ring oscillator is formed which contains a first path and a second path. The first path is defined from the selector 2(O) via the inverter $1_1$, the inverter $1_2$, - - -, and the inverter $1_{n-2}$ up to the selector (I1). The second path is defined from the selector 2(O) via the inverter $1_1$, the inverter $1_2$, - - -, and the inverter $1_n$ up to the selector (I2). In response to the select signal SEL supplied from the selector control circuit 3, any one of the first path and the second path may be selected in this voltage-controlled oscillator circuit.

Detailed Circuit Arrangements of Inverters and Selector

Figure 4:
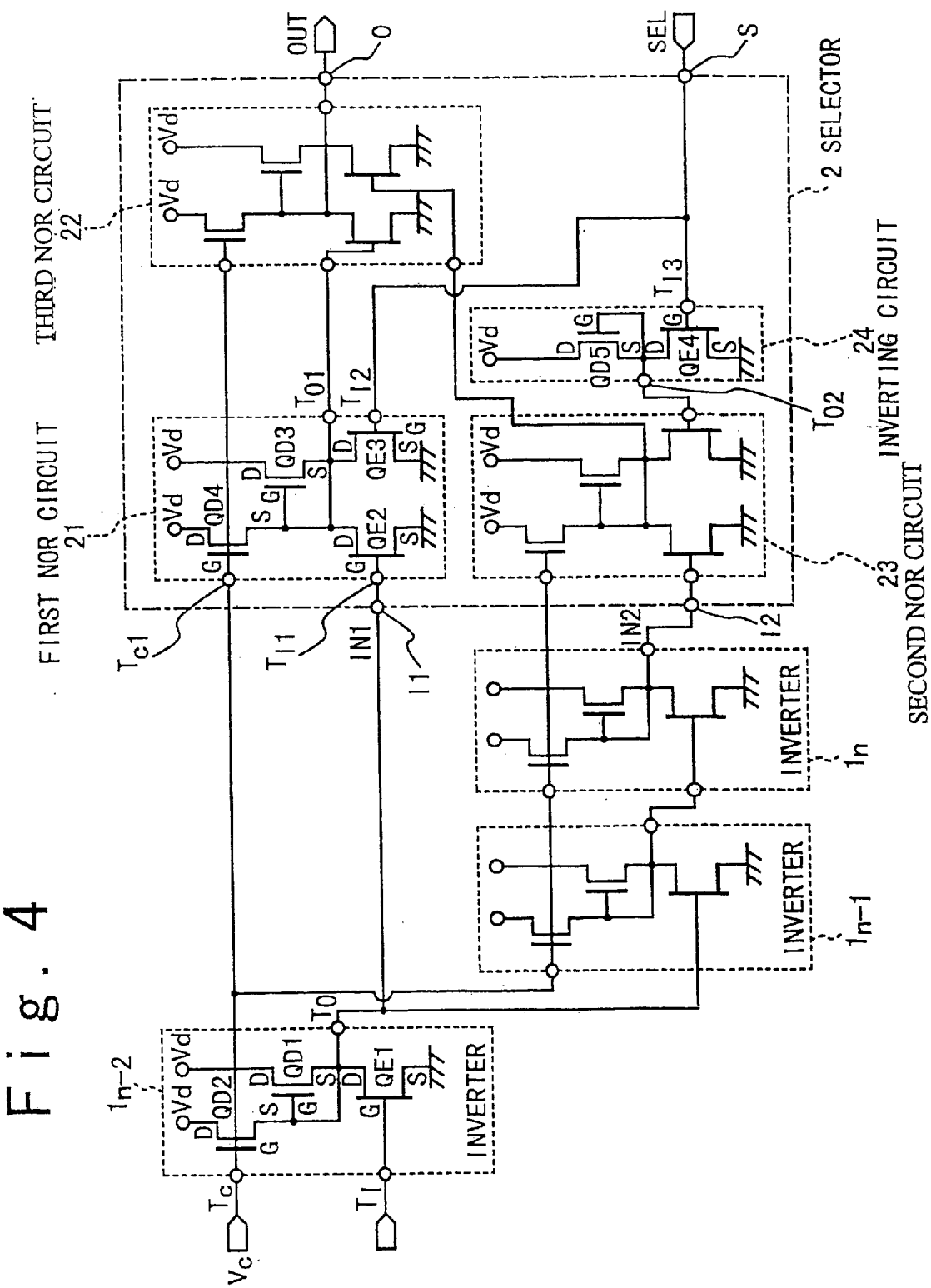
FIG. 4 is a circuit arrangement for showing a structural example of a selector employed in the voltage-controlled oscillator circuit of FIG. 3.

FIG. 4 is a circuit diagram for representing in detail a structural example of the respective inverters $1_1$ to $1_n$, and a structural example of the selector 2.

Similar to the conventional inverters, each of these inverters $1_1$ to $1_n$ is constituted by an enhancement-mode field-effect transistor (E-FET) QE1, a first depletion-mode field-effect transistor (D-FET) QD1, and a second depletion-mode field-effect transistor QD2. A source electrode S of the E-FET QE1 is connected to the ground potential, and a gate electrode G thereof is connected to the input terminal $T_I$. A gate electrode G of the first D-FET QD1 is connected to a drain electrode of the E-FET QE1, and a source electrode S of this first D-FET QD1 is connected to the drain electrode of the E-FET QE1, and also a drain electrode D thereof is connected to a power supply Vd. A source electrode S of the second D-FET QD2 is connected to the drain electrode D of the E-FET QE1, and a drain electrode D of this second D-FET QD2 is connected to the power supply Vd. A drain electrode D of the E-FET QE1 is connected to the output terminal $T_O$, and a gate electrode G of the second D-FET QD2 is connected to a voltage control terminal $T_C$. A control voltage $V_C$ used to vary an oscillating frequency is applied to this voltage control terminal $T_C$.

The selector 2 is arranged by a first NOR circuit 21, a second NOR circuit 22, a third NOR circuit 23, and an inverting circuit 24. Each of the NOR circuits 21 to 23 OR-gates the two input signals, and thereafter inverts the OR-gated signal. The inverting circuit 24 inverts a polarity of an input signal to thereby output the inverted input signal.

In this case, a first input terminal $T_{I1}$ of the first NOR circuit 21 is connected to the first input terminal I1, and the input signal IN1 is supplied from the inverter $1_{n-1}$ to this first input terminal. A second input terminal $T_{I2}$ of this first NOR circuit 21 is connected to the select terminal S, and the select signal SEL is inputted from the control circuit 3.

A first input terminal of the third NOR circuit 23 is connected to the second input terminal I2, and the input signal IN2 is supplied from the inverter $1_n$ to this first input terminal. A second input terminal of this third NOR circuit 23 is connected to an output terminal $T_{O2}$ of the inverting circuit 24, and the signal produced by inverting the select signal SEL is entered to this second input terminal. The input terminal $T_{I3}$ of this inverting circuit 24 is connected to the select terminal S, and the select signal SEL is inputted via the select terminal S to this input terminal $T_{I3}$.

Also, the output terminal $T_{O1}$ of the first NOR circuit 21 is connected to the first input terminal of the second NOR circuit 22, and the output terminal of the third NOR circuit 23 is connected to the second input terminal of the second NOR circuit 22. The output terminal of this second NOR circuit 22 is connected to the output terminal "O" from which the selected signal OUT is outputted.

The first NOR circuit 21 is arranged by additionally employing an enhancement-mode field-effect transistor QE3 as in the circuit arrangement of each of the inverters $1_1$ to $1_n$. In other words, the first NOR circuit 21 is arranged by a second enhancement-mode field-effect transistor QE2. a third enhancement-mode field-effect transistor QE3, a third depletion-mode field-effect transistor QD3, and also a fourth depletion-mode field-effect transistor QD4. A source electrode S of the second E-FET QE2 is connected to the ground potential, and a gate electrode G thereof is connected to the first input terminal $T_{I1}$. A source electrode S of the third E-FET QE3 is connected to the ground potential, a drain electrode D thereof is connected to a drain electrode D of the second E-FET2, and a gate electrode G thereof is connected to the second input terminal $T_{I2}$. The select signal SEL is supplied to this input terminal $T_{I2}$.

Both a gate electrode G and a source electrode S of the third D-FET QD3 are connected to the drain electrode D of the second E-FET QE2, and a drain electrode D thereof is connected to the power supply Vd. Also, the source electrode S of the fourth D-FET QD4 is connected to the drain electrode D of the second E-FET QE2, and a drain electrode D thereof is connected to the power supply Vd. Also, the gate electrode G of the fourth D-FET QD4 is connected to the voltage control terminal Tc. The control voltage Vc used to vary the oscillating frequency is applied to this voltage control terminal Tc. It should be understood that the circuit arrangements of the second NOR circuit 22 and the third NOR circuit 23 are the same as that of the above-explained first NOR circuit 21.

The inverting circuit 24 is arranged by a fourth enhancement-mode field-effect transistor QE4 and a fifth depletion-mode field-effect transistor QD5. A source electrode S of the fourth E-FET QE4 is connected to the ground potential, and a gate electrode S thereof is connected to the third input terminal $T_{I3}$. The select signal SEL is supplied to this input terminal $T_{I3}$. Both a gate electrode G and a source electrode S of the fifth D-FET QD5 are connected to the drain electrode D of the fourth E-FET QE4, and the drain electrode D is connected to the power supply Vd.

As indicated in FIG. 3, the selector control circuit 3 is arranged by a sixth depletion-mode field-effect transistor (D-FET) QD6, a resistor R, and a flip-flop 31. It should be noted that the sixth D-FET QD6 is manufactured by the same processes as those of the first D-FET QD1 of each inverter. A drain electrode D of this sixth D-FET QD6 is connected to the power supply Vd, and both a gate electrode G thereof and a source electrode S thereof are connected to one terminal of a resistor R. The other terminal of this resistor R is connected to the ground potential. The flip-flop 31 is constructed of a D type flip-flop. A data input terminal D of this flip-flop 31 is connected to the gate electrode G/source electrode S of the sixth D-FET QD6, and also to one end of the resistor R. An output terminal Q of the flip-flop 31 is connected to the select terminal S of the selector 2, and then the select signal SEL is supplied to this select terminal S. A reset signal Rs is from a control circuit (not shown) entered into a clock input terminal C of the flip-flop 31.

Operation of Voltage-Controlled Oscillator Circuit

When the threshold voltage Vt (absolute value) of the first D-FET QD1 contained in each of the inverters is shifted, or deviated so as to increase from the designed value in the above-explained circuit arrangement, the current flowing through this D-FET QD1 is increased. As a result, the propagation delay time tpd of each of these inverters is shortened, thereby the oscillating frequency of the voltage-controlled oscillator circuit becomes higher than a desirable frequency. In this case, since the sixth D-FET QD6 is manufactured by the same processes as those of the first D-FET QD1, the threshold voltage Vt is increased from the designed value similar to that of the first D-FET QD1. As a result, since the current flowing through the sixth D-FET 6 is similarly increased, the current flowing through the resistor R is increased, so that the voltage at the data input terminal D of the flip-flop 31 is increased.

Conversely, in such a case that the threshold voltage Vt (absolute value) of the first D-FET QD1 contained in each of the inverters is decreased from the designed value direction in the above-explained circuit arrangement, the current flowing through this D-FET QD1 is decreased. As a result, the propagation delay time tpd of each of these inverters is prolonged, thereby the oscillating frequency of the voltage-controlled oscillator circuit becomes lower than a desirable frequency. In this case, since the current flowing through the sixth D-FET 6 is similarly decreased, the current flowing through the resistor R is decreased, so that the voltage at the data input terminal D of the flip-flop 31 is decreased.

The flip-flop 31 is set to either a high level or a low level in response to a voltage applied to the data input terminal D when the reset signal Rs is entered.

In this embodiment, in such a case that the resistance value of the resistor R is determined in a manner that this flip-flop 31 is set to the low level when the above-described threshold voltage Vt is present within the designed value, if this threshold voltage Vt is present within this designed value, or is decreased from the designed value then the output voltage of the flip-flop 31 is fixed to the low level when the reset signal Rs is inputted to this flip-flop 31. As a result, the selector 2 selects the first input signal IN1. As previously explained, since the selector 2 is formed by adding the third E-FET QE3 to the circuit arrangement of the inverter, the propagation delay time tpd of the selector 2 corresponds to two sets of these inverters. As a consequence, in this case, the ring oscillator formed in the voltage-controlled oscillator circuit is equivalent to such a circuit arrangement that "n" inverters are connected to each other in a ring shape.

Conversely, when the above-explained threshold voltage Vt is increased from the designed value if the reset signal Rs is inputted, then the output of the flip-flop 31 is fixed to the high level. As a result, the selector 2 selects the second input signal IN2. In this case, the voltage-controlled oscillator circuit is equivalent to such a ring oscillator that (n+2) inverters are connected to each other in the ring shape. As a consequence, the overall propagation delay time of the ring oscillator is prolonged by two stages of these inverters, as compared with such a case that the threshold voltage Vt is decreased. Thus, the oscillating frequency at the voltage-controlled oscillator circuit is lowered.

Consequently, the below mentioned difficulties may be mitigated. That is, the oscillating frequency of the voltage-controlled oscillator circuit is increased, because the above-explained threshold voltage Vt is increased from the designed value. It should be understood that since the flip-flop 31 is set only when the reset signal Rs is entered, the timing for entering the reset signal Rs is properly selected, it is possible to avoid such a state that the stage number of the ring oscillator is switched while the ring oscillator is being operated. Therefore, there is no stability problem in operation.

On the other hand, in such a case that the resistance value of the resistor R is determined in such a way that the output of the flip-flop 31 becomes high level when the above-explained threshold voltage Vt is present at the designed value, the ring oscillator is equivalent to a case where (n+2) pieces of inverters are connected to each other in a ring shape. In this case, when the threshold voltage Vt is decreased from the designed value, if the reset signal Rs is inputted, then the output of the flip-flop 31 is fixed to the low level. As a result, the selector 2 selects the first input signal IN1. In this case, the voltage-controlled oscillator circuit is equivalent to a ring oscillator having "n" inverters connected to each other in the ring shape. As a consequence, the overall propagation delay time of the ring oscillator is shortened by two stages of these inverters, as compared with such a case that the threshold voltage Vt is at the designed value. Thus, the oscillating frequency of the voltage-controlled oscillator circuit is increased.

Consequently, the below mentioned difficulties may be mitigated. That is, the oscillating frequency of the voltage-controlled oscillator circuit is decreased, because the above-explained threshold voltage Vt is decreased from the designed value.

Figure 5:
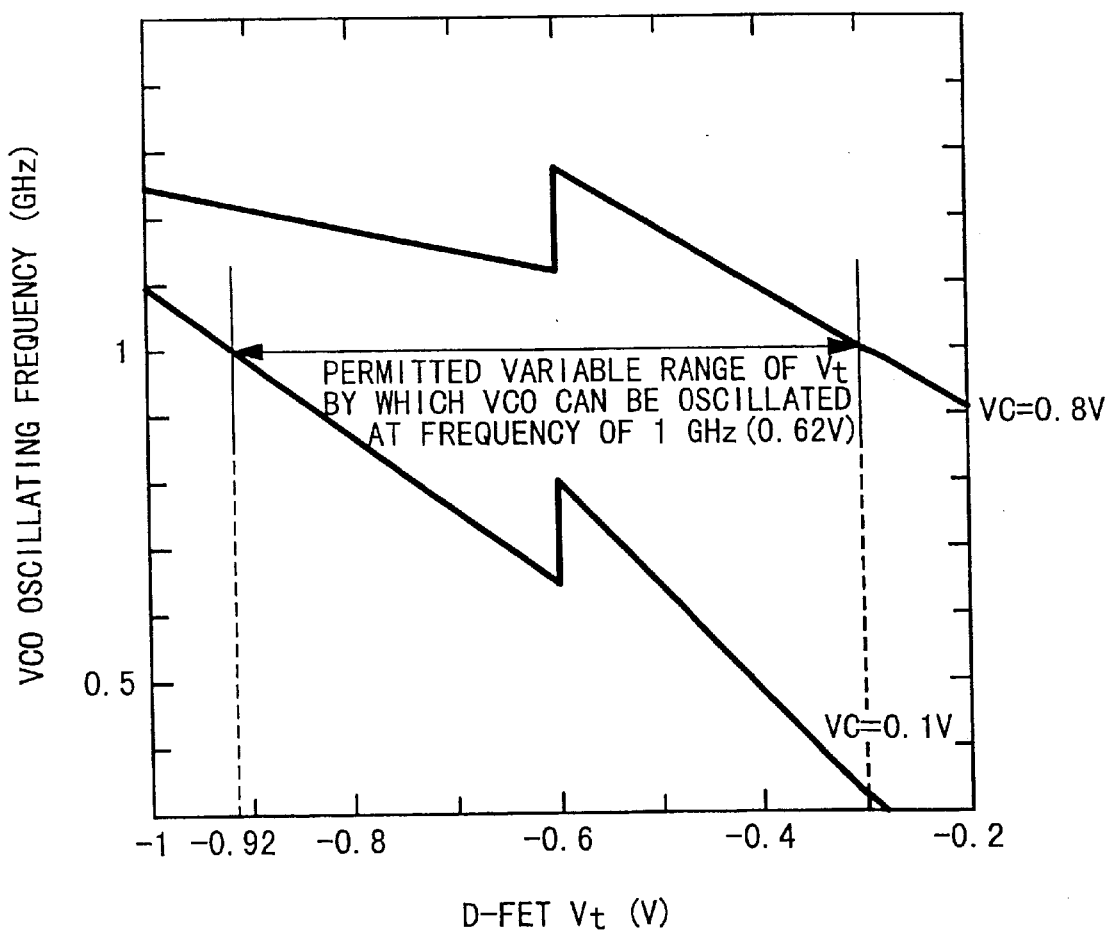
FIG. 5 is a diagram for showing a relationship of an oscillating frequency with respect to a threshold voltage Vt of a D-FET in the voltage-controlled oscillator circuit indicated in FIG. 3, namely a graphic representation for indicating a permitted variation range of the threshold voltage Vt by which the oscillator circuit can be oscillated at various frequencies.

FIG. 5 shows a relationship between a threshold voltage Vt of a depletion-mode field-effect transistor and an oscillating frequency in the voltage-controlled oscillator circuit indicated in FIG. 3. An abscissa represents the threshold voltage [V] of the D-FET, whereas an ordinate indicates the oscillating frequency (VCO oscillating frequency) of the voltage-controlled oscillator circuit [GHz]. In other words, FIG. 5 represents a simulation result of a permitted variation range for various threshold voltages at which the below-mentioned voltage-controlled oscillator can be oscillated at various frequencies, while varying the control voltage from 0.1V to 0.8V. In this simulation, the voltage-controlled oscillator circuit employs a ring oscillator. This ring oscillator is arranged by 11 sets of inverters (including two sets of inverters for constituting a selector) with employment of GaAs D-FETs and GaAs E-FETs. Also, in this simulation, the power supply voltage is selected to be 2V.

As indicated in FIG. 5, in the voltage-controlled oscillator circuit according to this first embodiment, the permitted variable range of the threshold voltage Vt of the D-FET at which the voltage-controlled oscillator can be oscillated in the frequency of 1[GHz], is defined from −0.92V to 0.30V, namely 0.62V. As a result, this variable range (0.62V) can be improved by approximately 55%, as compared with the conventional variable range (0.40V). Eventually, it is possible to obtain a voltage-controlled oscillator circuit whose permitted variable range for the threshold voltage of the D-FET is widened, as compared with that of the conventional voltage-controlled oscillator circuit.

It should also be noted that the GaAs D-FETs and the GaAs E-FETs, which can be operated in the high frequency range, are employed in the voltage-controlled oscillator circuit according to the first embodiment. Alternatively, even when the inverters and the selectors are constituted by such normally-employed MOS FETs operable in a lower frequency range, a similar effect may be achieved.

Also, the selector 2 is constituted by three sets of NOR circuits and one inverter circuit in this first embodiment. Alternatively, this selector 2 may be constituted by employing such a switch circuit capable of selecting any one of the first input signal IN1 and the second input signal IN2 in response to the select signal SEL. Also, as previously described, since the selector 2 is arranged in such a manner that each of the NOR circuits and the inverter circuit are constituted by employing the E-FETs and the D-FETs, there is a merit that the overall voltage-controlled oscillator circuit can be readily integrated.

Arrangement of Second Voltage-Controlled Oscillator Circuit

Figure 6:
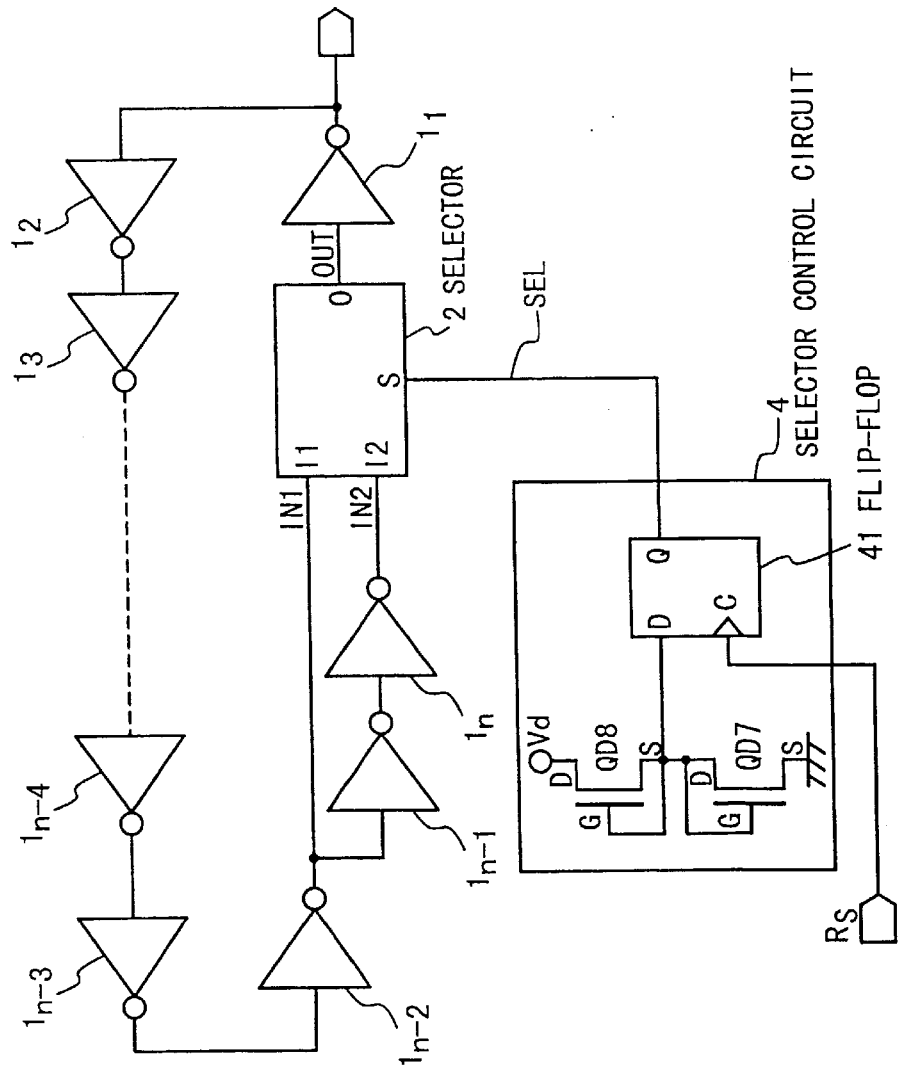
FIG. 6 is a circuit diagram for representing an arrangement of a voltage-controlled oscillator circuit according to a second embodiment of the present invention.

Referring now to a drawing, a second embodiment of the present invention will be explained. FIG. 6 is a circuit diagram for showing an arrangement of a voltage-controlled oscillator circuit according to the second embodiment of the present invention. In this voltage-controlled oscillator circuit according to the second embodiment, a depletion-mode field-effect transistor (D-FET) is employed instead of the resistor R of the selector control circuit according to the first embodiment.

As indicated in FIG. 6, the selector control circuit 4 according to this second embodiment is arranged by a seventh depletion-mode field-effect transistor QD7, an eighth depletion-mode field-effect transistor QD8, and a flip-flop 41. A drain electrode D of this eighth D-FET QD8 is connected to the power supply Vd, and both a gate electrode G thereof and a source electrode S thereof are connected to a gate electrode G of the seventh D-FET QD7 and a drain electrode D thereof. A source electrode S of the seventh D-FET QD7 is connected to the ground potential. The flip-flop 41 is constructed of a D type flip-flop. A data input terminal D of this flip-flop 41 is connected to the gate electrode G/source electrode S of the eighth D-FET QD8, and also to the gate electrode G/drain electrode D of the seventh D-FET QD7. An output terminal Q of the flipflop 41 is connected to a select terminal S of the selector 2, and then outputs the select signal SEL. A reset signal Rs from a control circuit (not shown) is entered into a clock input terminal C of the flip-flop 41.

Operations of Second Voltage-Controlled Oscillator

Also, in the above-described circuit arrangement of the second embodiment, since the seventh D-FET QD7 can have a similar function as that of the resistor R employed in the first embodiment, it is possible to achieve a similar effect to that of the first embodiment.

Furthermore, since the voltage-controlled oscillator circuit arrangement of this second embodiment no longer requires such a resistor R, the manufacturing process for the resistor can be omitted, resulting in a reduction of manufacturing cost.

With employment of the above-described circuit arrangement, the voltage-controlled oscillator circuits according to the present invention can provide the following advantages. That is, this voltage-controlled oscillator circuit contains the selector employed in the ring oscillator, and the selector control circuit. In this selector, the output signal derived from (n−2)th inverter is entered into one input terminal of this selector, the output signal derived from n-th inverter is entered into the other input terminal thereof, and any one of these output signals is outputted in response to the select signal. The selector control circuit is operated as follows. In such a case that the threshold voltage of the depletion-mode field-effect transistor which constitutes the load for the output side of each of the inverters is decreased from the designed value, this selector control circuit causes the selector to select the signal entered into one input terminal. Conversely, when the above-described threshold voltage is increased from the designed value, this selector control circuit causes the selector to select the signal entered into the other input terminal. As a result, the variation in the oscillating frequency, which is caused by changing the threshold voltage of the depletion-mode field-effect transistor, can be mitigated. Therefore, it is possible to obtain such a voltage-controlled oscillator circuit having a wide permitted variable range for the threshold voltage.

Also, the selector control circuit includes the flip-flop, the second depletion-mode field-effect transistor, and the third depletion-mode field-effect transistor. When the reset signal is inputted to the flip-flop, this flip-flop acquires the voltage applied to the data input terminal, and outputs the select signal in response to this input voltage. The source electrode of this second depletion-mode field-effect transistor is connected to the ground potential, and both the gate electrode thereof and the drain electrode thereof are connected to the data input terminal of the flip-flop. The source electrode and the drain electrode of the third depletion-mode field-effect transistor are connected to the gate electrode and the drain electrode of the second depletion-mode field-effect transistor, respectively. The drain electrode of this third depletion-mode field-effect transistor is connected to the power supply, and further this transistor is manufactured by the same process of the second depletion-mode field-effect transistor. As a consequence, the resistor is no longer required, and therefore, since the manufacturing processes for this resistor can be omitted, the total manufacturing cost can be reduced.

In particular, the inverter circuit, the first NOR circuit, the second NOR circuit, and the third NOR circuit, which constitute the selector, are arranged by employing the depletion-type field-effect transistors and the enhancement-mode field-effect transistors. As a consequence, the voltage-controlled oscillator circuit can be manufactured in the integrated circuit form.

What is claimed is:

1. A voltage-controlled oscillator circuit comprising:
    n (n is an odd integer) inverters connected to each other in a serial connection;
    a selector control circuit producing a select signal,
    said selector control circuit containing a selector field-effect transistor,
    said selector field-effect transistor having a threshold voltage which determines the select signal; and
    a selector for selecting one of an output signal from an (n−i)-th one (0<i<n) of said n inverters and another output signal from an n-th one of said n inverters in response to the select signal produced by said selector control circuit,
    wherein said selector supplies the selected signal to a first one of said n inverters,
    wherein said selector control circuit produces said select signal such that when said threshold voltage of said selector field-effect transistor is smaller than or equal to a preselected value, said selector selects the output signal from said (n−i)-th one of n inverters, and such that when said threshold voltage of said selector field-effect transistor is larger than said preselected value, said selector selects the output signal from said n-th one of n inverters.

2. A voltage-controlled oscillator circuit according to claim 1, wherein said selector field-effect transistor contained in said selector control circuit is manufactured by a process which is same as a process of manufacturing field-effect transistors contained in said n inverters.

3. A voltage-controlled oscillator circuit according to claim 2, wherein said selector control circuit includes:
    said selector field-effect transistor, a drain electrode of which is connected to a power supply;
    a resistor having two ends, one end of which is connected to a gate electrode of said selector field-effect transistor and a source electrode thereof, and the other end of which is grounded; and
    a flip-flop to which a voltage signal applied from said one end of the resistor is set in synchronism with an externally supplied reset signal, and which supplies said set voltage signal as the select signal to said selector.

4. A voltage-controlled oscillator circuit according to claim 3, wherein a resistance value of said resistor is determined such that when said threshold voltage is smaller than or equal to said preselected value, said flip-flop outputs the select signal such that the output signal from said (n−i)-th one of n inverters is selected by said selector.

5. A voltage-controlled oscillator circuit according to claim 3, wherein a resistance value of said resistor is determined such that when said threshold voltage is smaller than or equal to said preselected value, said flip-flop outputs the select signal such that the output signal from said n-th one of n inverters is selected by said selector.

6. A voltage-controlled oscillator circuit according to claim 3, wherein said flip-flop maintains a logic state of said select signal until said reset signal is subsequently inputted to said flip-flop.

7. A voltage-controlled oscillator circuit according to claim 3, wherein each of said n inverters includes:
    an enhancement-mode field-effect transistor, a source electrode of which is connected to a ground potential, and a gate electrode of which is connected to an input terminal of said each of n inverters;
    a first depletion-mode field-effect transistor, a gate electrode and a source electrode of which are connected to a drain electrode of said enhancement-mode field-effect transistor, and a drain electrode of which is connected to a power supply; and
    a second depletion-mode field-effect transistor, a source electrode of which is connected to the drain electrode of said enhancement-mode field-effect transistor, a drain electrode of which is connected to the power supply, and a gate electrode of which is connected to a voltage control terminal of each of said n inverters, wherein a control voltage to control an oscillating frequency is externally supplied to said voltage control terminal.

8. A voltage-controlled oscillator circuit according to claim 3, wherein said selector includes:
    an inverting circuit for inverting a polarity of the select signal from said selector control circuit;
    a first NOR circuit for OR-gating the output signal from said (n−i)-th one of n inverters and the select signal from said selector control circuit to invert the OR-gated signal;
    a second NOR circuit for OR-gating the output signal from said n-th one of n inverters and the output signal from said inverting circuit to invert the OR-gated signal; and
    a third NOR circuit for OR-gating the output signal outputted from said first NOR circuit and the output signal outputted from said second NOR circuit to invert the OR-gated signal.

9. A voltage-controlled oscillator circuit according to claim 2, wherein said selector control circuit includes:
    said selector field-effect transistor, a drain electrode of which is connected to a power supply;
    another field-effect transistor, a source electrode of which is connected to a ground potential, and a gate electrode and a drain electrode of which are connected to the gate electrode and the source electrode of said field-effect transistor; and
    a flip-flop for setting a voltage signal from said drain electrode of said other field-effect transistor in synchronism with an externally-supplied reset signal, and for supplying the set voltage signal as the select signal to said selector.

10. A voltage-controlled oscillator circuit according to claim 9, wherein an output voltage characteristic of said other field-effect transistor is determined such that when said threshold voltage is smaller than or equal to said preselected value, said flip-flop outputs the select signal for causing said selector to select the output signal from said (n−i)-th one of n inverters.

11. A voltage-controlled oscillator circuit according to claim, 9 wherein an output voltage characteristic of said other field-effect transistor is determined such that when said threshold voltage is smaller than or equal to said preselected value, said flip-flop outputs the select signal for causing said selector to select the output signal from said n-th one of n inverters.

12. A voltage-controlled oscillator circuit according to claim 9, wherein said flip-flop maintains a logic state of said select signal until said reset signal is subsequently inputted to said flip-flop.

13. A voltage-controlled oscillator circuit according to claim 9, wherein each of said n inverters includes:
- an enhancement-mode field-effect transistor, a source electrode of which is connected to a ground potential, and a gate electrode of which is connected to an input terminal of said inverter;
- a first depletion-mode field-effect transistor, a gate electrode and a source electrode of which are connected to a drain electrode of said enhancement-mode field-effect transistor, and a drain electrode of which is connected to a power supply; and
- a second depletion-mode field-effect transistor, a source electrode of which is connected to the drain electrode of said enhancement-mode field-effect transistor, a drain electrode of which is connected to the power supply, and the gate electrode of which is connected to a voltage control terminal of each of said n inverters, wherein a control voltage to control an oscillating frequency is externally supplied to said voltage control terminal.

14. A voltage-controlled oscillator circuit according to claim 9, wherein said selector includes:
- an inverting circuit for inverting a polarity of the select signal from said selector control circuit;
- a first NOR circuit for OR-gating the output signal from said (n−i)-th one of n inverters and the select signal from said selector control circuit to invert the OR-gated signal;
- a second NOR circuit for OR-gating the output signal from said n-th one of n inverters and the output signal from said inverting circuit to invert the OR-gated signal; and
- a third NOR circuit for OR-gating the output signal outputted from said first NOR circuit and the output signal outputted from said second NOR circuit to invert the OR-gated signal.

15. A voltage-controlled oscillating method in which an oscillating frequency is varied in response to an externally supplied control voltage, comprising the steps of:
- (a) providing n (n is an odd positive integer) inverters connected to each other in a serial connection;
- (b) producing a select signal based on a threshold voltage of a selector field-effect transistor; and
- (c) selecting one of an output signal from an (n−i)-th (0<i<n) of the n inverters and another output signal from an n-th one of the n inverters in response to the select signal produced in said (b) step, and supplying the selected signal to a first one of the n inverters, wherein said (b) step includes:
- (d) judging whether or not said threshold voltage of the selector field-effect transistor is smaller than or equal to a preselected value;
- (e) producing said select signal such that the output signal from said (n−i)-th one of n inverters is selected when a judgment result of said (d) step is made that the threshold voltage of said selector field-effect transistor is smaller than or equal to said preselected value; and
- (f) producing said select signal such that the output signal from said n-th one of n inverters is selected when a judgment result of said (d) step is made that the threshold voltage of said selector field-effect transistor is larger than said preselected value.

16. A voltage-controlled oscillating method according to claim 15, wherein said (d) step includes:
- (g) producing a voltage corresponding to the threshold voltages of each of said n inverters; and
- (h) judging whether or not the threshold voltage of said selector field-effect transistor is smaller than or equal to the preselected value, based on said voltage produced in said (g) step.

17. A voltage-controlled oscillator circuit comprising:
- n (n is an odd positive integer) inverters connected to each other in a serial connection;
- select signal producing means containing a selector field-effect transistor, for producing a select signal based on a threshold voltage of said selector field-effect transistor; and
- selecting means for selecting one of an output signal from an (n−i)-th one (0<i<n) of said n inverters and another output signal from an n-th one of said n inverters in response to the select signal produced in said select signal producing means, wherein said selecting means supplies said selected signal to a first one of said n inverters, wherein said select signal producing means includes:
- judging means for judging whether or not said threshold voltage of the selector field-effect transistor is smaller than or equal to a preselected value;
- first means for producing said select signal such that the output signal from said (n−i)-th one of n inverters is selected when a judgment result of said judging means is made that the threshold voltage of said selector field-effect transistor is smaller than or equal to said preselected value; and
- second means for producing said select signal such that the output signal from said n-th one of n inverters is selected when a judgment result of said judging means is made that the threshold voltage of said selector field-effect transistor is larger than said preselected value.

18. A voltage-controlled oscillator circuit according to claim 17, wherein said judging means includes:
- third means for producing a voltage corresponding to the threshold voltages of each of said n inverters; and
- fourth means for judging whether or not the threshold voltage of said selector field-effect transistor is smaller than or equal to the preselected value, based on said voltage produced in said third means.

* * * * *